(12) United States Patent
Kubota

(10) Patent No.: US 7,297,038 B2
(45) Date of Patent: Nov. 20, 2007

(54) METHOD FOR MANUFACTURING ORGANIC ELECTRO LUMINESCENCE PANEL

(75) Inventor: Hirofumi Kubota, Tsurugashima (JP)

(73) Assignee: Pioneer Corporation, Tokyo (JP)

( * ) Notice: Subject to any disclaimer, the term of this patent is extended or adjusted under 35 U.S.C. 154(b) by 342 days.

(21) Appl. No.: 11/009,775

(22) Filed: Dec. 9, 2004

(65) Prior Publication Data

US 2005/0130548 A1    Jun. 16, 2005

(30) Foreign Application Priority Data

Dec. 16, 2003    (JP) .......................... P2003-418414

(51) Int. Cl.
*H01J 9/00*    (2006.01)
(52) U.S. Cl. ....................................................... 445/24
(58) Field of Classification Search ............ 445/23–25; 313/506, 504, 512
See application file for complete search history.

(56) References Cited

U.S. PATENT DOCUMENTS 6,469,439 B2 *    10/2002    Himeshima et al. ........ 313/506

FOREIGN PATENT DOCUMENTS

JP    2001-76870    3/2001

* cited by examiner

*Primary Examiner*—Joseph Williams
(74) *Attorney, Agent, or Firm*—Ladas & Parry LLP

(57) ABSTRACT

A method for manufacturing an organic electro luminescence panel by forming a first electrode layer on a substrate; then forming a second electrode layer on the substrate; then forming a passivation layer on the substrate to cover the organic material layer and the second electrode layer; and then radiating either electron beams or ultraviolet rays onto locations other than the previously mentioned light-emitting portion of the organic layer.

6 Claims, 1 Drawing Sheet

METHOD FOR MANUFACTURING ORGANIC ELECTRO LUMINESCENCE PANEL

BACKGROUND OF THE INVENTION

1. Field of the Invention

The present application relates to a method for manufacturing an organic Electro Luminescence panel used in display devices and the like.

2. Related Art

Heretofore, an organic EL (electro luminescence) panel has been known as a panel used in display devices and the like. The organic EL panel has an organic light-emitting layer sandwiched by two electrodes on a transparent substrate. The organic light-emitting layer is patterned according to the form of a picture element, and is so constituted that only picture element portions emit light.

As a method for patterning the picture elements (light-emitting portions), a method using an insulating film has been known to the art. As another method for patterning the picture elements, a method, wherein electron beams or ultraviolet rays are radiated onto the area other than the light-emitting pattern of the light-emitting layer to deteriorate the organic matter composing the irradiated area, and to bereave the light-emitting function, has been studies (for example, refer to Japanese Patent Application Laid-Open No. 2001-76870).

SUMMARY OF THE INVENTION

However, according to a conventional patterning method using an insulating film, a photomask or the like had to be used, and the resist or the like had to be patterned. When the light-emitting pattern was changed, the photomask had also to be changed. Thus, the use of the insulating film increased time, labor and costs.

On the other hand, in the patterning method using ultraviolet rays or electron beams, the radiated area can be controlled by the scanning system or the like so that ultraviolet rays or electron beams do not radiate picture elements. However, in order that oxygen or moisture does not deteriorate the organic light-emitting layer and the second electrode layer, the environment of radiating ultraviolet rays or electron beams is restricted, and ultraviolet rays or electron beams must be radiated immediately after forming the organic EL element.

Therefore, an object of the present application is to solve the inconvenience in the above-described prior art, and to provide a method for manufacturing an organic EL panel using simple facilities in short time and at reduced manufacturing costs.

The above object of the present invention can be achieved by a method for manufacturing organic electro luminescence (EL) panel provided with steps of: forming a first electrode layer on a substrate; forming an organic material layer on entire or partial surface of the substrate; forming a second electrode layer on the substrate; forming a passivation layer on the substrate to cover at least the organic material layer and the second electrode layer; and radiating at least either one of electron beams or ultraviolet rays onto locations other than previously specified light-emitting portion of the organic material layer.

According to the present invention, in the organic EL panel manufactured by this manufacturing method, the organic material of the location other than the light-emitting portions of the organic material layer irradiated by electron beams or ultraviolet rays can be deteriorated. As a result, the luminous efficiency of location other than the light-emitting portions is extremely lowered, and the light-emitting patterns of the organic EL panel can be obtained.

And according to this manufacturing method, since the organic material composing the organic material layer is protected by passivation layer, the environment when electron beams or ultraviolet rays are radiated is not limited, but for example, the electron beams or ultraviolet rays can be radiated even in the air. Further according to this manufacturing method, the organic EL panel can be stored in the state wherein the organic material layer has been formed on the entire surface of the transparent substrate and the passivation layer has been formed thereon, and electron beams or ultraviolet rays can be radiated onto the organic material layer as required to fabricate the organic EL panel having light-emitting patterns.

Therefore, since the method for manufacturing the organic EL panel of this embodiment can save time, labor and costs, and the environment and time for radiating electron beams or ultraviolet rays are not limited, the manufacturing equipment and facilities can be simplified.

In one aspect of the present invention, the method for manufacturing the organic EL panel is wherein the electron beams are radiated onto the organic material layer from the side not having the substrate.

In another aspect of the present invention, the method for manufacturing an organic EL panel, wherein deflected electron beams are radiated onto the organic material layer.

In further aspect of the present invention, the method for manufacturing an organic EL panel, wherein a metal mask is installed on the side of the organic material layer not having the substrate, and the electron beams are radiated onto the organic material layer from the metal mask side.

In further aspect of the present invention, the method for manufacturing an organic EL panel, wherein the second electrode layer and the passivation layer are formed from a transparent material, and the ultraviolet rays are radiated onto the organic material layer from the side not having the substrate.

Figure 1:
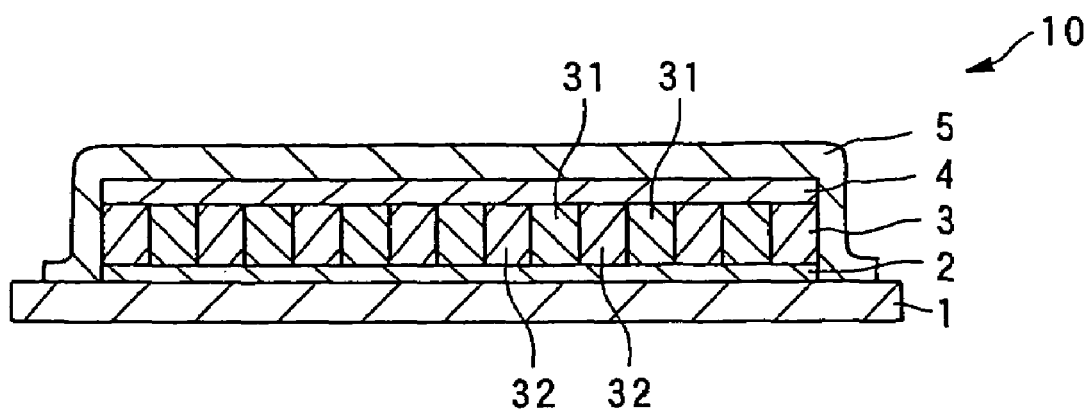
FIG. 1 is a schematic sectional view for illustrating an organic EL panel of the embodiment.

Each meaning of the reference numbers in the drawings are as follows:

1: transparent substrate, 2: first electrode layer, 3: organic material layer, 31: light-emitting portion, 32: portion other than light emitting-portion, 4: second electrode layer, 5: passivation layer, and 10: organic EL panel

DESCRIPTION OF THE PREFERRED EMBODIMENTS

The method for manufacturing an organic EL panel of an embodiment of the present invention will be specifically described below with reference to drawings.

As FIG. 1 shows, the organic EL panel 10 of the embodiment is generally formed by sequentially laminating a first electrode layer 2, an organic material layer 3, a second electrode layer 4 and a passivation layer 5 on a transparent substrate 1. In the organic EL panel 10, other optional layers can also be formed when required.

Figure 2:
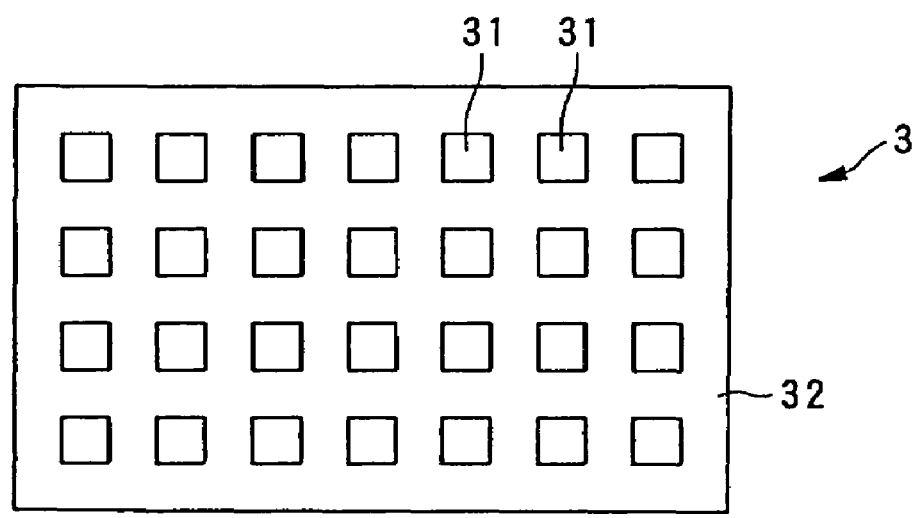
FIG. 2 is a diagram showing an example of the light-emission patterning of an organic material layer in the organic EL panel of the embodiment.

FIG. 2 shows an example of the pattern of light-emitting portions 31 (picture elements) of the organic material layer 3. The portions other than the lattice portion 32 are the light-emitting portions 31 as a picture element.

First, the general constitution of the organic EL panel 10 will be described.

As the transparent substrate 1, a flat rectangular glass or transparent resin sheet is normally used. As the glass or transparent resin sheet, the one normally used as the transparent substrate of organic EL panels is used, and the material thereof is not specifically limited.

The first electrode layer 2 is normally an anode. For the first electrode layer 2, a transparent material is used so that the light of the organic material layer 3 can be taken out to the exterior. Although the material for the first electrode layer 2 is not specifically limited, a transparent electrode such as ITO (indium tin oxide) and the like is used. Note that, although the first electrode layer 2 is normally formed on the entire surface of the transparent substrate 1, it can be formed on a part of the surface of the transparent substrate 1 as required.

The organic material layer 3 is formed of an organic material that emits light when the holes transported from the first electrode layer 2 and the electrons transported from the second electrode layer 4 are recombined and excited. Although the materials for the organic material layer 3 is not specifically limited, organic materials well known to those skilled in the art normally used in the organic light-emitting layers, such as an aluminum complex ($Alq_3$), are used. Here, on the first electrode layer 2 side of the organic material layer 3, a hole transport layer or the like may be formed. And on the second electrode layer 4 side of the organic material layer 3, an electron transport layer or the like may be formed. The materials for these layers are not specifically limited as long as they have the above-described functions. Although the thickness of the organic material layer 3 is not specifically limited, it is normally about 10 to 1000 nm, and preferably about 50 to 500 nm. The organic material layer 3 is normally formed on the entire surface of the transparent substrate 1 other than the areas for outgoing line electrodes and the like (not shown); however, it can be formed on a part of the transparent substrate 1 as required. The detail of the organic material layer 3 will be described later.

The second electrode layer 4 is normally a cathode. The material for the second electrode layer 4 is not specifically limited, and a material normally used in the cathode of an organic EL, such as aluminum and ITO, can be used. The second electrode layer 4 is formed on the entire surface or a part of the surface of the transparent substrate 1 as required.

The passivation layer 5 seals the material of the organic material layer 3, protects the organic material layer 3 from the invasion of moisture or the like, and prevents the deterioration of light emission of the organic material layer 3. Although the materials for the passivation layer 5 are not specifically limited, materials used in the passivation layer or sealing layer of an organic EL are normally used, and for example, silicon nitride, silicon nitride oxide and the like are used. Although the thickness of the passivation layer 5 is not specifically limited, it is normally about 0.1 to 50 µm, and preferably about 0.5 to 5 µm. The passivation layer 5 is normally formed on the entire or partial surface of the transparent substrate 1. As FIG. 1 shows, the passivation layer 5 is formed so as to cover at least the organic material layer 3 and the second electrode layer 4.

The above-described layers are laminated in the order of the transparent substrate 1, the first electrode layer 2, the organic material layer 3, the second electrode layer 4, and the passivation layer 5.

The first electrode layer 2, the organic material layer 3, the second electrode layer 4, and the passivation layer 5 are formed on the transparent substrate 1 using various methods well known to those skilled in the art selected from printing, coating, CVD (chemical vapor deposition), sputtering, vapor deposition or the like. Furthermore, the thickness of the layers and films composing the organic EL panel 10 is not specifically limited, but is appropriately selected depending on the functions thereof. The terms "upper" and "lower" used herein mean upper and lower in the state wherein the transparent substrate 1 of the organic EL panel 10 are placed on the lower side and the passivation layer 5 of the organic EL panel 10 are placed on upper sides, respectively.

Next, a method for forming the light-emitting portions 31 of the organic material layer 3 will be described.

In order to form the light-emitting portions 31 of the organic material layer 3 in the embodiment, which can be defined in anyway in the organic EL panel, at least the organic material layer 3 is formed on the entire or partial surface of the transparent substrate 1, a passivation layer 5 is formed, and then, at least either electron beams or ultraviolet rays are radiated onto the location 32 other than the light-emitting portions 31. Thereby, the organic material in the location 32 irradiated by electron beams or ultraviolet rays can be deteriorated. As a result, the luminous efficiency of the location 32 other than the light-emitting portions 31 lowers extremely, and when the organic EL panel 10 is used, the pattern wherein only the light-emitting portions 31 emit light can be obtained.

The electron beams or ultraviolet rays are radiated after forming the organic material layer 3, the second electrode layer 4 and the passivation layer 5 on the transparent substrate 1.

Thereby, since the organic material composing the organic material layer 3 and the material composing the second electrode layer 4 are protected by the passivation layer 5, the environment when electron beams or ultraviolet rays are radiated is not specifically limited, but electron beams or ultraviolet rays can be radiated not only in a vacuum but also in the air. As a result, the equipment or facilities for radiating electron beams or ultraviolet rays can be simplified.

The organic EL panel 10 can be stored in the state wherein the organic material layer 3 has been formed on the entire surface of the transparent substrate 1, and the passivation layer 5 has further been formed; and when required, at least either electron beams or ultraviolet rays can be radiated onto the organic material layer 3 of the organic EL panel 10 to form the light-emitting pattern. Thus, since a large quantity of organic EL panels having no light-emitting patterns can be produced and stored, the manufacturing costs can be reduced. Furthermore, different light-emitting patterns can also be formed on the stored organic EL panels as required.

Next, the radiation of electron beams and the radiation of ultraviolet rays will be described.

In the present application, the electron beams or the ultraviolet rays within the range normally referred to as the electron beams or the ultraviolet rays can be used, and are not specifically limited. Normally, the electron beams are the flow of electrons narrowed down to substantially linear or spot form, and are obtained from thermoelectronic emission or the like. Ultraviolet rays are electromagnetic waves having wavelengths longer than X-rays and shorter than the shortest wavelength of visible light. And the ultraviolet rays' specific wavelength is about 1.0 nm to 0.4 µm. The electron beams or the ultraviolet rays can be generated and radiated using equipment well known to those skilled in the art, and the devices for generating and radiating the electron beams or the ultraviolet rays is not specifically limited.

Electron beams can be radiated from the side having the organic material layer 3 of the transparent substrate 1, or can be radiated from the side on which layers are not formed by the transparent substrate 1. Of these, the radiation from the side having the organic material layer 3 of the transparent substrate 1 is preferred. By thus radiating the electron beams, fine light-emitting patterns can be formed. Therefore, an organic EL panel having finer light-emitting patterns (picture element patterns) can be manufactured. If the electron beams are radiated from the side on which layers are not formed on the transparent substrate 1, the electron beams may be diffused when passing through the transparent substrate 1, and fine light-emitting patterns may not be obtained.

When a thin film is used as the transparent substrate 1, and ultraviolet rays are radiate onto the thin film, the ultraviolet rays are absorbed in the thin film, and patterning becomes difficult. Therefore, when a thin film is used as the transparent substrate 1, the use of electron beams can better pattern the light-emitting portion 31 of the organic material layer 3. When the second electrode layer 4 is formed of a material not transmitting ultraviolet rays, such as aluminum, the electron beams can transmit through the second electrode layer 4, and the light-emitting portion 31 can be patterned of the organic material layer 3.

Electron beams can be deflected to irradiate a predetermined location. Means to deflect electron beams is not specifically limited, and for example, electron beams can be deflected by controlling a magnetic field. Controlling the magnetic field can control the region irradiated by the electron beams, and desired light-emitting patterns of the organic EL panel can be obtained. The magnetic field can be controlled using any conventionally known methods, such as a method using a magnetic coil. Alternatively, the equipment for radiating electron beams can be fixed to radiate electron beams to a fixed location, and the organic EL panel can be in turn moved so that the electron beams are radiated to a predetermined location of the organic EL panel.

According to this embodiment, as described above, since desired light-emitting patterns of the organic EL panel can be formed without using photomasks or the like, an organic EL panel can be conveniently and economically fabricated. Of course, electron beams can be radiated onto the entire surface of the organic material layer 3, and the light-emitting portion 31 can be pattern using a metal mask.

Although the energy of electron beams is not specifically limited, electron beams having energy of about 1 to 500 keV (kilo electron Volt) are normally used. Although the dose of electron beams is also not specifically limited as long as it is within a range to bereave the light-emitting characteristics of the organic material composing the organic material layer 3, it can be normally within the range between about 1 and 1000 Mrad, and preferably between about 20 and 100 Mrad.

On the other hand, ultraviolet rays can be radiated from the side having the organic material layer 3 of the transparent substrate 1, or can be radiated from the side on which layers are not formed on the transparent substrate 1. Of these, when radiation is performed from the side having the organic material layer 3 of the transparent substrate 1, the second electrode layer 4 and the passivation layer 5 are formed from transparent materials, and radiation can be performed by controlling the region irradiated by the ultraviolet rays as described above. On the other hand, when radiation is performed from the side on which layers are not formed on the transparent substrate 1, radiation can also be performed by controlling the region irradiated by the ultraviolet rays as described above, or by patterning using photomasks.

The ultraviolet rays can be radiated onto a predetermined location using a deflector and a galvanometer mirror or the like. Alternatively, the light source can be fixed to radiate the ultraviolet rays onto a fixed location, and the organic EL panel can be moved to radiate the ultraviolet rays onto a predetermined location of the organic EL panel. By thus radiating ultraviolet rays, the region irradiated by the ultraviolet rays can be controlled, and desired light-emitting patterns of the EL panel can be obtained.

Although the dose of ultraviolet rays is not specifically limited, it is normally about 10 mJ/cm$^2$ to 1 kJ/cm$^2$.

In FIG. 2, the shape and arrangement of the light-emitting portion 31 in the organic material layer 3 are squares and matrix arrangement, respectively. However, the shape and arrangement of the light emitting portion 31 in the organic material layer 3 are not limited thereto, various shapes and arrangements can be used as required.

Thus, in this embodiment, the organic EL panel 10 is manufactured by laminating a first electrode layer 2, an organic material layer 3, a second electrode layer 4 and a passivation layer 5 on the entire or partial surface of the transparent substrate 1 as the substrate; and by radiating electron beams or ultraviolet rays to form light-emitting patterns on the organic material layer 3.

As described above, the method for manufacturing an organic EL panel 10 according to this embodiment is a method comprising steps of: forming a first electrode layer 2 on a transparent substrate 1; forming an organic material layer 3 on entire or partial surface of the transparent substrate 1 and on the first electrode layer 2; forming a second electrode layer 4 on the transparent substrate 1 and on the organic material layer 3; forming a passivation layer 5 on the transparent substrate 1 to cover at least the organic material layer 3 and the second electrode layer 4; and radiating at least either one of electron beams or ultraviolet rays onto locations 32 other than previously specified light-emitting portion 31 of the organic material layer 3.

Therefore, in the organic EL panel 10 manufactured by this manufacturing method, the organic material of the location 32 other than the light-emitting portions 31 of the organic material layer 3 irradiated by electron beams or ultraviolet rays is deteriorated. As a result, the luminous efficiency of location 32 other than the light-emitting portions 31 is extremely lowered, and the light-emitting patterns of the organic EL panel 10 are obtained.

According to this manufacturing method, since the organic material composing the organic material layer 3 is protected by passivation layer 5, the environment when electron beams or ultraviolet rays are radiated is not limited, but for example, the electron beams or ultraviolet rays are radiated even in the air. Further according to this manufacturing method, the organic EL panel 10 is stored in the state wherein the organic material layer 3 has been formed on the entire surface of the transparent substrate 1 and the passivation layer 5 has been formed thereon, and electron beams or ultraviolet rays are radiated onto the organic material layer 3 as required to fabricate the organic EL panel 10 having light-emitting patterns.

Therefore, since the method for manufacturing the organic EL panel 10 of this embodiment can save time, labor and costs, and the environment and time for radiating electron beams or ultraviolet rays are not limited, the manufacturing equipment and facilities can be simplified.

The method for manufacturing the organic EL panel 10 of this embodiment is wherein the electron beams are radiated onto the organic material layer 3 from the side not having the transparent substrate 1.

According to this manufacturing method, electron beams are radiated onto the organic material layer 3 without passing through the transparent substrate 1. Therefore, fine light-emitting patterns are formed in the organic material layer 3 without the diffusion of electron beam. As a result, the organic EL panel 10 having finer light-emitting patterns is manufactured.

The method for manufacturing the organic EL panel 10 of this embodiment is wherein deflected electron beams are radiated onto the organic material layer 3.

According to this manufacturing method, by deflecting the electron beams using, for example, a magnetic field, optional light-emitting patterns of the organic EL panel 10 are obtained without using metal masks or the like. Thereby, the organic EL panel 10 is conveniently and economically fabricated.

The method for manufacturing the organic EL panel 10 of this embodiment is wherein a metal mask installed on the side of the organic material layer 3 not having the transparent substrate 1, and the electron beams are radiated onto the organic material layer 3 from the metal mask side.

According to this manufacturing method, by using the metal mask, optional light-emitting patterns of the organic EL panel 10 are obtained. Thereby, the organic EL panel 10 having optional light-emitting patterns is surely fabricated.

The method for manufacturing the organic EL panel 10 of this embodiment is wherein the second electrode layer 4 and the passivation layer 5 are formed of transparent materials, and the ultraviolet rays are radiated onto the organic material layer 3 from the side not having the transparent substrate 1.

Therefore, according to this manufacturing method, since the second electrode layer 4 and the passivation layer 5 are formed of transparent materials, light-emitting portions 31 can be formed on the organic material layer 3 even if the ultraviolet rays are radiated onto the organic material layer 3 from the side not having the transparent substrate 1.

The invention may be embodied in other specific forms without departing from the spirit or essential characteristics thereof. The present embodiments are therefore to be considered in all respects as illustrative and not restrictive, the scope of the invention being indicated by the appended claims rather than by the foregoing description and all changes which come within the meaning and range of equivalency of the claims are therefore intended to be embraced therein.

The entire disclosure of Japanese Patent Application No. 2003-418414 filed on Dec. 16, 2003 including the specification, claims, drawings and summary is incorporated herein by reference in its entirety.

What is claimed is:

1. A method for manufacturing an organic electro luminescence panel comprising the steps of:
    forming a first electrode layer on a substrate;
    forming an organic material layer at least partially covering said first electrode layer;
    forming a second electrode layer on said organic material layer;
    forming a passivation layer on said second electrode layer to cover at least said organic material layer and said second electrode layer; and
    then radiating at least either one of electron beams or ultraviolet rays onto locations to be reduced in emission efficiency of said organic material layer.

2. The method for manufacturing an organic electro luminescence panel according to claim 1, wherein
    the electron beams are radiated onto said organic material layer from a side thereof facing away from said substrate.

3. The method for manufacturing an organic electro luminescence panel according to claim 1, wherein
    deflected electron beams are radiated onto said organic material layer.

4. The method for manufacturing an organic electro luminescence panel according to claim 2, wherein
    a metal mask is installed on the side of said organic material layer facing away from said substrate, and the electron beams are radiated onto said organic material layer from the metal mask side.

5. The method for manufacturing an organic electro luminescence panel according to claim 1, wherein
    said second electrode layer is formed from a transparent material, said passivation layer is formed from a transparent material, and
    the ultraviolet rays are radiated onto said organic material layer from the side facing away from said substrate.

6. The method for manufacturing an organic electro luminescence panel according to claim 2, wherein
    deflected electron beams are radiated onto said organic material layer.

* * * * *